United States Patent
Lee et al.

(10) Patent No.: US 9,209,349 B2
(45) Date of Patent: Dec. 8, 2015

(54) METHOD OF FABRICATING NITRIDE SEMICONDUCTOR LIGHT EMITTING DEVICE

(71) Applicant: SAMSUNG ELECTRONICS CO., LTD., Suwon-si, Gyeonggi-do (KR)

(72) Inventors: Kee Won Lee, Suwon-si (KR); Jong Uk Seo, Suwon-si (KR); Suk Ho Yoon, Seoul (KR); Keon Hun Lee, Seoul (KR); Sang Don Lee, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 134 days.

(21) Appl. No.: 14/184,171

(22) Filed: Feb. 19, 2014

(65) Prior Publication Data

US 2014/0231863 A1      Aug. 21, 2014

(30) Foreign Application Priority Data

Feb. 21, 2013 (KR) .................. 10-2013-0018649

(51) Int. Cl.
*H01L 21/00* (2006.01)
*H01L 33/00* (2010.01)
*H01L 21/02* (2006.01)
*H01L 33/32* (2010.01)
(Continued)

(52) U.S. Cl.
CPC .......... *H01L 33/007* (2013.01); *H01L 21/0237* (2013.01); *H01L 21/0242* (2013.01); *H01L 21/0254* (2013.01); *H01L 21/02381* (2013.01); *H01L 21/02458* (2013.01); *H01L 21/02658* (2013.01); *H01L 33/0075* (2013.01); *H01L 33/12* (2013.01); *H01L 33/16* (2013.01); *H01L 33/32* (2013.01)

(58) Field of Classification Search
CPC ... H01L 33/32; H01L 21/0242; H01L 33/007; H01L 33/0075; H01L 21/025458; H01L 21/0254; H01L 21/02658
See application file for complete search history.

(56) References Cited

U.S. PATENT DOCUMENTS

| | | | |
|---|---|---|---|
| 6,984,841 B2 * | 1/2006 | Tsuda | B82Y 20/00 257/12 |
| 7,569,461 B2 | 8/2009 | Lee et al. | |
| 7,968,361 B2 | 6/2011 | Osawa et al. | |

(Continued)

FOREIGN PATENT DOCUMENTS

| JP | 3756831 B2 | 3/2006 |
|---|---|---|
| JP | 2009-141085 A | 6/2009 |

(Continued)

*Primary Examiner* — Alonzo Chambliss
(74) *Attorney, Agent, or Firm* — McDermott Will & Emery LLP

(57) ABSTRACT

A method of fabricating a nitride semiconductor light emitting device is provided. The method includes growing a first group-III-nitride semiconductor layer on a substrate, the first group-III-nitride semiconductor layer having a top surface formed as a group-III-rich surface exhibiting a group-III-polarity and a bottom surface formed as a N-rich surface exhibiting a N-polarity. The method further includes selectively etching a N-polarity region in the top surface of the first group III nitride semiconductor layer, forming a second group III nitride semiconductor layer on the first group III nitride semiconductor layer to fill the etched N-polarity region and forming a light emitting structure including first and second conductivity type nitride semiconductor layers and an active layer on the second group III nitride semiconductor layer.

20 Claims, 8 Drawing Sheets

(51) Int. Cl.
*H01L 33/12* (2010.01)
*H01L 33/16* (2010.01)

(56) References Cited

U.S. PATENT DOCUMENTS

| | | | | |
|---|---|---|---|---|
| 8,232,568 B2* | 7/2012 | Zhang | ................... | H01L 33/24 257/190 |
| 2011/0089436 A1 | 4/2011 | Jeong et al. | | |
| 2011/0127544 A1 | 6/2011 | Paskova et al. | | |
| 2011/0210312 A1* | 9/2011 | Tu | ........................ | H01L 33/22 257/13 |
| 2012/0070929 A1 | 3/2012 | Hashimoto et al. | | |
| 2012/0217537 A1 | 8/2012 | Jin et al. | | |

FOREIGN PATENT DOCUMENTS

| | | |
|---|---|---|
| KR | 10-0691251 B1 | 3/2007 |
| KR | 10-0781659 B1 | 12/2007 |
| KR | 2012-0079308 A | 7/2012 |
| KR | 10-2012-0099544 A | 9/2012 |

\* cited by examiner

METHOD OF FABRICATING NITRIDE SEMICONDUCTOR LIGHT EMITTING DEVICE

CROSS-REFERENCE TO RELATED APPLICATION

This application claims priority to, and benefit of, Korean Patent Application No. 10-2013-0018469 filed on Feb. 21, 2013, with the Korean Intellectual Property Office, the disclosure of which is incorporated herein by reference.

TECHNICAL FIELD

The present inventive concept relates to a nitride semiconductor light emitting device and a fabrication method thereof.

BACKGROUND

A semiconductor light emitting device, such as a light emitting diode (LED) or the like, is a device emitting light through a material contained within the semiconductor light emitting device. LEDs convert energy generated through electron-hole recombination occurring at p-n junctions between p-type and n-type semiconductors into light to be emitted from the LED. Such LEDs have been widely used as light sources in lighting devices, display devices, and the like, and the development of such devices is being accelerated.

In particular, as mobile phone keypads, turn signal lamps, camera flashes and other devices using LEDs (e.g., GaN-based LEDs) are commercialized, the development of general lighting devices using LEDs is being actively undertaken. As the use of LEDs is extended from small portable devices to large, high output, and high efficiency products such as the backlight units of large screen TVs, headlights of vehicles, general lighting devices, and the like, light sources having characteristics required by the corresponding products are being increasingly sought.

SUMMARY

An embodiment of the present inventive concept relates to a nitride semiconductor light emitting device and a fabrication method thereof that can provide semiconductor layers having superior quality.

A method embodiment of the present inventive concept for fabricating a nitride semiconductor light emitting device includes growing a first group III nitride semiconductor layer on a substrate, the first group III nitride semiconductor layer having a top surface formed as a group III rich surface exhibiting a group III polarity and a bottom surface formed as a N-rich surface exhibiting a N-polarity, selectively etching a N-polarity region in the top surface of the first group III nitride semiconductor layer, forming a second group III nitride semiconductor layer on the first group III nitride semiconductor layer so as to fill the etched N-polarity region, and forming a light emitting structure on the second group III nitride semiconductor layer, the light emitting structure including a first conductivity type nitride semiconductor layer, an active layer, and a second conductivity type nitride semiconductor layer.

In an embodiment, the bottom surface of the first group III nitride semiconductor layer may be disposed to contact a surface of the substrate. The etching of the N-polarity region may be performed up to a depth allowing the surface of the substrate to be exposed. The substrate may be a sapphire substrate.

In another embodiment, the etching of the N-polarity region may be performed up to a depth allowing the surface of the substrate not to be exposed. The substrate may be a Si substrate.

In yet another embodiment, the etching of the N-polarity region may be performed by chemical wet etching. The chemical wet etching may be performed using a KOH solution having a concentration of 10% to 50%. The chemical wet etching may be performed at 60° C. to 100° C. within an hour. These examples are illustrative and are not intended to limit the disclosed embodiments.

In an embodiment, the first and second group III nitride semiconductor layers may be expressed by $Al_xIn_yGa_{(1-x-y)}N$, where $0 \leq x \leq 1$, $0 \leq y \leq 1$, and $0 \leq x+y \leq 1$. The first and second group III nitride semiconductor layers may have the same composition. The group III polarity may be an Al-polarity or a Ga-polarity.

According to another embodiment of the present inventive concept, a nitride semiconductor light emitting device includes: a substrate, a first group III nitride semiconductor layer formed on the substrate and having at least one etched region, from which an N-polarity region is removed from a top surface. The semiconductor light emitting device further includes a second group III nitride semiconductor layer formed on the first group III nitride semiconductor layer and filling the at least one etched region, and a light emitting structure formed on the second group III nitride semiconductor layer and including a first conductivity type nitride semiconductor layer, an active layer, and a second conductivity type nitride semiconductor layer, where a bottom surface of the first group III nitride semiconductor layer in contact with the substrate is formed as a N-rich surface exhibiting a N-polarity, and a top surface opposite to the bottom surface is formed as a group III rich surface exhibiting a group III polarity.

In an embodiment, the first and second group III nitride semiconductor layers may be expressed by $Al_xIn_yGa_{(1-x-y)}N$, where $0 \leq x \leq 1$, $0 \leq y \leq 1$, and $0 \leq x+y \leq 1$.

In an embodiment, the first and second group III nitride semiconductor layers may have the same composition.

BRIEF DESCRIPTION OF THE DRAWINGS

The above and other aspects, features and other advantages of the present inventive embodiments will be more clearly understood from the following detailed description taken in conjunction with the accompanying drawings, in which.

DETAILED DESCRIPTION OF THE EMBODIMENTS

Figure 1:
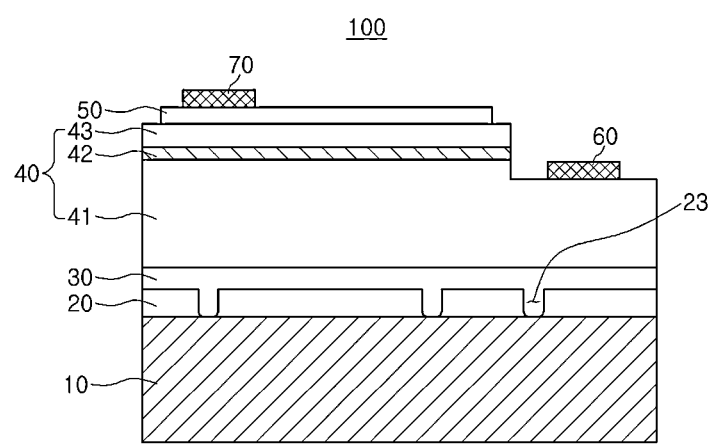
FIG. 1 is a cross-sectional view of a nitride semiconductor light emitting device according to an embodiment of the present inventive concept.

Embodiments of the present inventive concept will now be described in detail with reference to the accompanying drawings.

The present inventive concept may, however, be exemplified in many different forms and should not be construed as being limited to the specific embodiments set forth herein. Rather, these embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

FIG. 1 is a cross-sectional view of a nitride semiconductor light emitting device according to an embodiment of the present inventive concept, and FIGS. 2 through 6 are views illustrating a method of fabricating the nitride semiconductor light emitting device of FIG. 1.

A method of fabricating a nitride semiconductor light emitting device according to an embodiment of the present inventive concept includes forming a first group III nitride semiconductor layer 20 on a substrate 10, etching a portion of the first group III nitride semiconductor layer 20, forming a second group III nitride semiconductor layer 30 on the first group III nitride semiconductor layer 20, and forming a light emitting structure 40 on the second group III nitride semiconductor layer 30.

Figure 2:
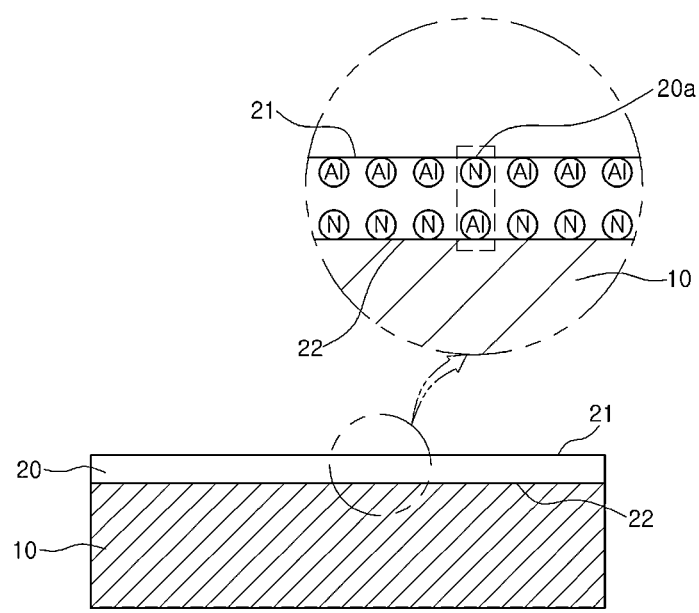
FIGS. 2 through 6 are views illustrating a method of fabricating the nitride semiconductor light emitting device of FIG. 1 according to an embodiment of the present inventive concept.

As shown in FIG. 2, after the substrate 10 is prepared, the first group III nitride semiconductor layer 20 having a top surface 21 and a bottom surface 22 may be formed on the substrate 10. In an embodiment, the substrate 10 may be formed of at least one of sapphire, SiC, Si, $MgAl_2O_4$, MgO, $LiAlO_2$, $LiGaO_2$ and GaN materials, but the present inventive concept is not limited thereto. In an embodiment of the present inventive concept, a sapphire substrate may be used.

In an embodiment, the first group III nitride semiconductor layer 20 is formed on the substrate 10. The first group III nitride semiconductor layer 20 may be formed of a semiconductor material expressed by $Al_xIn_yGa_{(1-x-y)}N$, and representative materials formed by such an expression may include AlN, GaN, AlGaN, and InGaN. Here, x and y values may, for example, have the following ranges: $0 \leq x \leq 1$, $0 \leq y \leq 1$, and $0 \leq x+y \leq 1$. In an embodiment of the present inventive concept, AlN may be used for forming first group III nitride semiconductor layer 20.

In an embodiment of the present inventive concept, the first group III nitride semiconductor layer 20 includes the top surface 21 and the bottom surface 22 in different polarity configurations. In this case, for example, the top surface 21 may have a group III polarity, while the bottom surface 22 may have a nitride (N) polarity. In an embodiment of the present inventive concept, the group III element may be aluminum (Al).

In an embodiment of the present inventive concept, the bottom surface 22 of the first group III nitride semiconductor layer 20 having the N-polarity may be disposed in contact with the substrate 10. The top surface 21 of the first group III nitride semiconductor layer 20 having the Al-polarity may be disposed to be opposite to the bottom surface 22.

In an embodiment of the present inventive concept, the first group III nitride semiconductor layer 20 may have a Wurtzite crystal structure or a non-centrosymmetric crystal structure. Therefore, one surface of the first group III nitride semiconductor layer 20 may have the Al-polarity (hereinafter, referred to as "Al-polarity region"), while the other surface of the first group III nitride semiconductor layer 20 may have the N-polarity (hereinafter, referred to as "N-polarity region"). Both surfaces of the first group III nitride semiconductor layer 20 may have different physical properties due to a difference in surface polarity.

For example, the Al-polarity region and the N-polarity region may have different physical properties including, but not limited to, etching rate, surface recombination, defects, surface potential and the like. Such differences in physical properties may lead to differences in surface characteristics between the Al-polarity region and the N-polarity region. Specifically, the Al-polarity region of the first group III nitride semiconductor layer 20 may have superior surface flatness and low combination with impurities, such that it may have improved crystalline characteristics in comparison to the N-polarity region. Accordingly, in an example case where a semiconductor layer is re-grown on the Al-polarity region of the first group III nitride semiconductor layer 20, the re-grown semiconductor layer may have a relatively flat surface.

In contrast, in another example case where a semiconductor layer is formed on the N-polarity region, defects such as hillock, column or pyramid shaped grains, or the like may be generated. This can result in degraded surface characteristics.

In some aspects, spontaneous polarization may be generated due to difference in polarities on both surfaces of the first group III nitride semiconductor layer 20. Thus, surface band bending characteristics may be shown differently in the Al-polarity region and the N-polarity region. In addition, since the Al-polarity region has low ohmic contact resistance and low leakage current, it may achieve superior electrical characteristics over the N-polarity region. Furthermore, both surfaces of the first group III nitride semiconductor layer 20 may react to an etching solution (e.g., KOH) at different rates due to their difference in polarities. Specifically, the Al-polarity region may imperceptibly react to the etching solution, while the N-polarity region may actively react to the etching solution and is highly etched.

As stated above, the Al-polarity region can be superior to the N-polarity region in terms of surface flatness, combination of impurities, re-growth characteristics, electrical characteristics and etching characteristics. Therefore, in an embodiment of the present inventive concept, it can be preferable to allow the entirety of a surface to be used for the growth of a semiconductor layer to have the Al-polarity region. However, in an example case where the first group III nitride semiconductor layer 20 is formed of AlN, a N-polarity region 20a may be mixed into the Al-polarity region as a result of oxygen generated during the fabrication process. When the N-polarity region 20a is mixed into the Al-polarity region, a pit may be formed in a surface of the semiconductor layer, and surface morphology may be reduced. Therefore, in an example case where the N-polarity region 20a formed in the Al-polarity region is removed, surface characteristics of the semiconductor layer may be improved.

In this manner, the top surface 21 of the first group III nitride semiconductor layer 20 may be formed as a group III rich surface exhibiting a group III polarity. Such formation can result from an amount of group III elements present in the top surface 21 being greater than that of nitrides, while the bottom surface 22 opposite to the top surface 21 may be formed as a N-rich surface. The N-rich surface can exhibit an N-polarity due to an amount of nitrides present in the N-rich surface being greater than that of group III elements.

According to an embodiment of the present inventive concept, the N-polarity region 20a mixed into the top surface 21 of the first group III nitride semiconductor layer 20 may be removed to improve the characteristics of the first group III nitride semiconductor layer 20.

Figure 3:
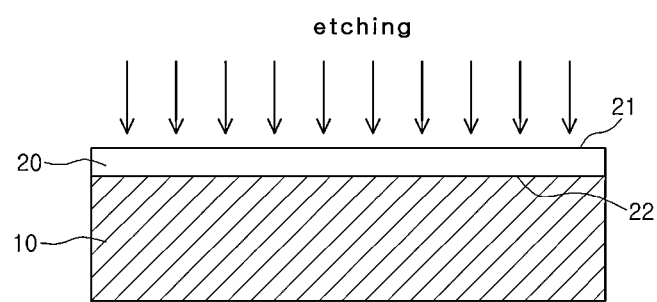

In order to remove the N-polarity region 20a from the top surface 21, the N-polarity region 20a may be etched as shown in FIG. 3. According to an embodiment of the present inventive concept, the etching process may be performed by chemical wet etching. The etching solution used in the chemical wet etching process may be KOH, $H_2SO_4$ or $H_3PO_4$. In an embodiment of the present inventive concept, KOH may be used. Specifically, KOH may be, for example, a solution having a concentration of 10% to 50% and allow for etching at 60° C. to 100° C. within an hour. This example is illustrative and is not intended to limit the embodiments.

Figure 4:
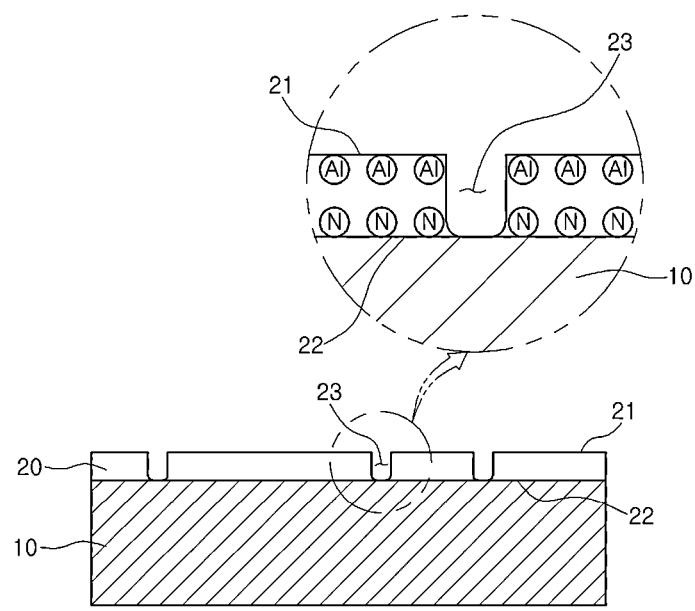

Since the group III polarity region on the top surface 21 has a low degree of reactivity with the etching solution, it may serve as a mask preventing portions of the semiconductor layer other than the N-polarity region 20a from being etched during the etching process. On the other hand, since the N-polarity region 20a has a relatively high degree of reactivity with the etching solution, it may be subjected to a higher etching rate as compared with the group III polarity region. Therefore, only the N-polarity region 20a may be removed. Through the etching process, the N-polarity region 20a of the first group III nitride semiconductor layer 20 may be etched and removed to form a recess 23 as shown in FIG. 4.

Figure 7:
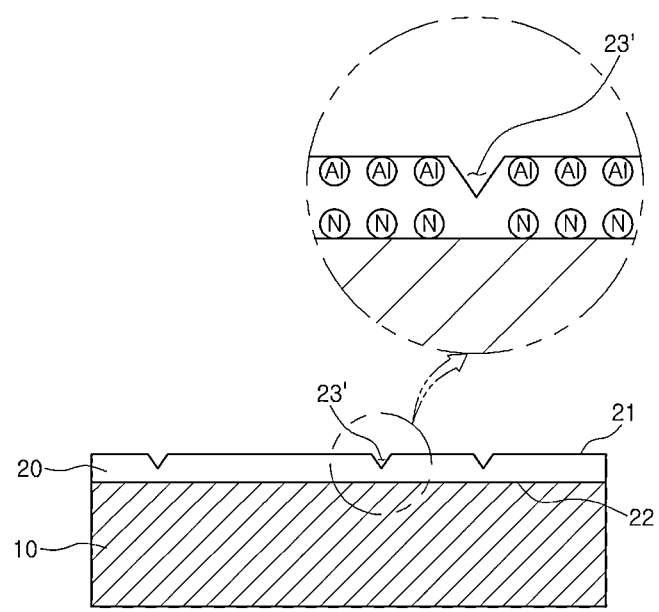
FIG. 7 is a view illustrating another example of the nitride semiconductor light emitting device according to the embodiment of the present inventive concept.

When the N-polarity region 20a is etched, the etching process may be performed to allow the top surface of the substrate 10 to be exposed through a bottom surface of the recess 23. However, in an example case where the substrate 10 (e.g. a sapphire substrate) does not have a low degree of reactivity with the etching solution, the substrate may also be etched. Therefore, an etching depth may need to be controlled. Specifically, as shown in FIG. 7, a recess 23' may be formed to have a depth allowing the top surface of the substrate 10 not to be exposed, so that the substrate 10 may not be etched by the etching solution. In the case in which the first group III nitride semiconductor layer 20 is formed on a Si substrate, the etching depth may need to be controlled in order to prevent the Si substrate from being etched.

Figure 8A:
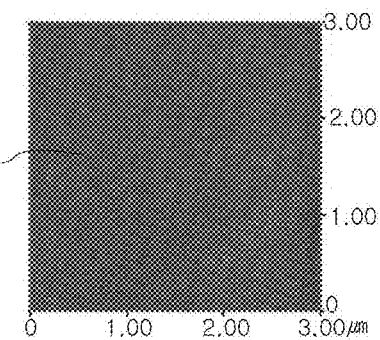
FIGS. 8A through 8C are images illustrating a process of forming recesses in a first group III nitride semiconductor layer of FIG. 1 according to an embodiment of the present inventive concept.
Figure 8B:
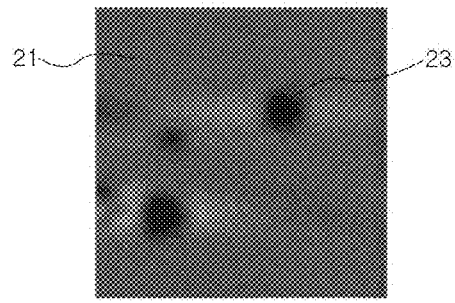
Figure 8C:
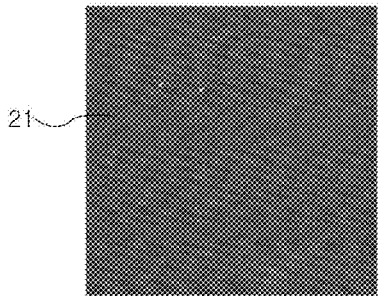

FIGS. 8A and 8B are images of the first group III nitride semiconductor layer 20, captured by an atomic force microscope (AFM), before the etching process (see FIG. 8A) and after the etching process (see FIG. 8B). It can be seen that only the N-polarity region is etched to form the recess 23. However, in an example case where the etching process is performed with the concentration of the etching solution and an etching temperature inappropriate for selectively etching the first group III nitride semiconductor layer 20, the selective etching of the N-polarity region may not be properly performed and the entirety of the first group III nitride semiconductor layer 20 may be etched. FIG. 8C is an image of the first group III nitride semiconductor layer 20, captured by the AFM, having no recess due to the failure of the selective etching of the N-polarity region.

Figure 5:
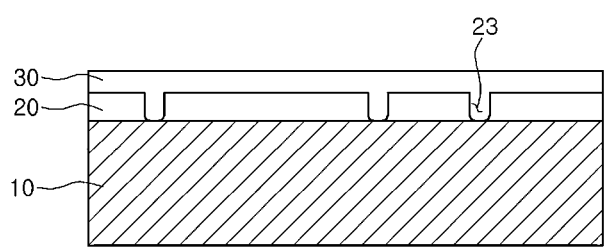

Next, as shown in FIG. 5, a second group III nitride semiconductor layer 30 may be formed on the first group III nitride semiconductor layer 20 while filling the recess 23.

In an embodiment of the present inventive concept, the second group III nitride semiconductor layer 30 may be formed of a semiconductor material having the same composition as that of the first group III nitride semiconductor layer 20, or may be formed of a semiconductor material having a different composition.

In the case in which the second group III nitride semiconductor layer 30 is formed of the same composition material as that of the first group III nitride semiconductor layer 20, the second group III nitride semiconductor layer 30 may be laterally grown to fill the recess 23 of the first group III nitride semiconductor layer 20. Since the second group III nitride semiconductor layer 30 laterally grown from the first group III nitride semiconductor layer 20 can have the same polarity as the group III polarity of the first group III nitride semiconductor layer 20, the N-polarity may not be exposed through a top surface of the second group III nitride semiconductor layer 30. Therefore, the quality of the semiconductor layer may be improved.

As a result of comparison of X-ray diffraction (XRD) values in the example case where the first group III nitride semiconductor layer 20 is only formed or in the case where the second group III nitride semiconductor layer 30 is formed on the first group III nitride semiconductor layer 20 through the above process, the former shows a full width at half maximum (FWHM) of 300 arcsec and the latter shows a full width at half maximum (FWHM) of 262 arcsec, reduced by approximately 10%. These examples are illustrative and are not intended to limit the embodiments.

Figure 6:
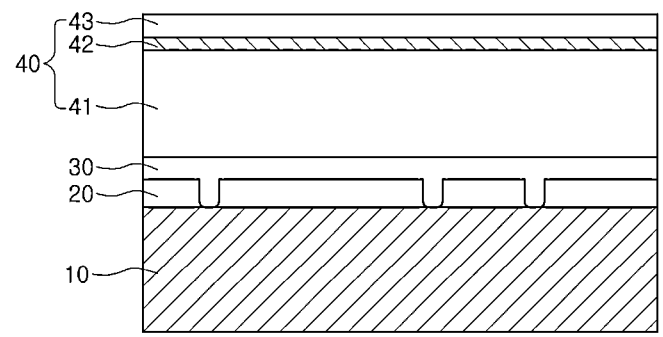

In an embodiment of the present inventive concept, and as shown in FIG. 6, the light emitting structure 40 may be formed on the second group III nitride semiconductor layer 30. The light emitting structure 40 may include a first conductivity type nitride semiconductor layer 41, an active layer 42, and a second conductivity type nitride semiconductor layer 43. Here, the first conductivity type nitride semiconductor layer 41 may include an n-type semiconductor layer, and the second conductivity type nitride semiconductor layer 43 may include a p-type semiconductor layer.

In an embodiment of the present inventive concept, the n-type semiconductor layer and the p-type semiconductor layer may be formed of a semiconductor material. The semiconductor material can be respectively doped with an n-type impurity and a p-type impurity having the same composition of $Al_xIn_yGa_{(1-x-y)}N$ as that of the first and second group III nitride semiconductor layers 20 and 30. In an example aspect, Si, Ge, Se, Te, C or the like may be used as the n-type impurity. Mg, Zn, Be or the like may be used as the p-type impurity. These examples are illustrative and are not intended to limit the disclosed embodiments.

In an embodiment of the present inventive concept, a GaN layer may be used as the first and second conductivity type nitride semiconductor layers 41 and 43. Thus, for example, an n-GaN layer may be used as the first conductivity type nitride semiconductor layer 41, and a p-GaN layer may be used as the second conductivity type nitride semiconductor layer 43.

The light emitting structure 40 may, for example, be grown by metal organic chemical vapor deposition (MOCVD), molecular beam epitaxy (MBE), or the like.

In an embodiment of the present inventive concept, the active layer 42 may have a multiple quantum well (MQW) structure in which quantum well layers and quantum barrier layers are alternately stacked. For example, the active layer 42 may have a multiple quantum well (MQW) structure in which quantum well layers and quantum barrier layers expressed by $Al_xIn_yGa_{(1-x-y)}N$ ($0 \leq x \leq 1$, $0 \leq y \leq 1$, $0 \leq x+y \leq 1$) are alternately stacked, so that it may have a predetermined energy bandgap. Such a quantum well structure can lead to electron-hole recombination, causing light emisson. Alternatively, the active layer 42 may have a single quantum well (SQW) structure. The active layer 42 may emit visible light having a wavelength of approximately 350 nm to 680 nm The active layer 42 may be grown by metal organic chemical vapor deposition (MOCVD), molecular beam epitaxy (MBE), or the like, in a manner similar to the growth method of the first and second conductivity type nitride semiconductor layers 41 and 43.

In an embodiment of the present inventive concept, and as shown in FIG. 1, the light emitting structure 40 may be mesa-etched to expose a portion of the first conductivity type nitride semiconductor layer 41. First and second electrodes 60 and 70 may be formed on respective regions of the first and second conductivity type nitride semiconductor layers 41 and 43. In this way, the nitride semiconductor light emitting device 100 may be fabricated.

In an embodiment of the present inventive concept, the first and second electrodes 60 and 70 may be formed as a single layer or a plurality of layers. The layers may be formed of a material selected from a group comprising ITO, Ni, Au, Ag, Ti, Cr and Cu. The first and second electrodes 60 and 70 may be formed by a deposition method such as chemical vapor deposition, e-beam evaporation or the like, a sputtering method or the like. In addition, a transparent electrode layer 50 may be formed below the second electrode 70 for current spreading.

As set forth above, according to embodiments of the inventive concept, the quality of a semiconductor layer may be improved by reducing dislocation caused by a difference in lattice constants between a substrate and the semiconductor layer.

While the present inventive concept has been shown and described in connection with the embodiments, it will be apparent to those skilled in the art that modifications and variations can be made without departing from the spirit and scope of the inventive concept as defined by the appended claims.

What is claimed is:

1. A method of fabricating a nitride semiconductor light emitting device, the method comprising:
    growing a first group III nitride semiconductor layer on a substrate, the first group III nitride semiconductor layer having a top surface formed as a group III rich surface exhibiting a group III polarity and a bottom surface formed as a N-rich surface exhibiting a N-polarity;
    selectively etching an N-polarity region in the top surface of the first group III nitride semiconductor layer;
    forming a second group III nitride semiconductor layer on the first group III nitride semiconductor layer to fill the etched N-polarity region; and
    forming a light emitting structure on the second group III nitride semiconductor layer, the light emitting structure including a first conductivity type nitride semiconductor layer, an active layer, and a second conductivity type nitride semiconductor layer.

2. The method of claim 1, wherein the bottom surface of the first group III nitride semiconductor layer is disposed to contact a surface of the substrate.

3. The method of claim 2, wherein the etching of the N-polarity region is performed up to a depth allowing the surface of the substrate to be exposed.

4. The method of claim 2, wherein the etching of the N-polarity region is performed up to a depth allowing the surface of the substrate not to be exposed.

5. The method of claim 1, wherein the substrate is a sapphire substrate.

6. The method of claim 1, wherein the substrate is a Si substrate.

7. The method of claim 1, wherein the etching of the N-polarity region is performed by chemical wet etching.

8. The method of claim 7, wherein the chemical wet etching is performed using a KOH solution having a concentration of 10% to 50%.

9. The method of claim 7, wherein the chemical wet etching is performed at 60° C. to 100° C. within an hour.

10. The method of claim 1, wherein the first and second group III nitride semiconductor layers are expressed by $Al_xIn_yGa_{(1-x-y)}N$, where $0 \le x \le 1$, $0 \le y \le 1$, and $0 \le x+y \le 1$.

11. The method of claim 1, wherein the first and second group III nitride semiconductor layers have an identical composition.

12. The method of claim 1, wherein the group III polarity is an Al-polarity or a Ga-polarity.

13. A nitride semiconductor light emitting device, comprising:
    a substrate;
    a first group III nitride semiconductor layer formed on the substrate, wherein the first group III nitride semiconductor layer includes at least one recesss on a top surface thereof from which an N-polarity region is removed;
    a second group III nitride semiconductor layer formed on the first group III nitride semiconductor layer, the second group III nitride semiconductor layer filling the at least one etched region; and
    a light emitting structure disposed on the second group III nitride semiconductor layer, the light emitting structure including a first conductivity type nitride semiconductor layer, an active layer, and a second conductivity type nitride semiconductor layer,
    wherein a bottom surface of the first group III nitride semiconductor layer in contact with the substrate is a N-rich surface exhibiting an N-polarity, and the top surface opposite to the bottom surface is a group III rich surface exhibiting a group III polarity.

14. The nitride semiconductor light emitting device of claim 13, wherein the first and second group III nitride semiconductor layers are expressed by $Al_xIn_yGa_{(1-x-y)}N$, where $0 \le x \le 1$, $0 \le y \le 1$, and $0 \le x+y \le 1$.

15. The nitride semiconductor light emitting device of claim 14, wherein the first and second group III nitride semiconductor layers have an identical composition.

16. A method for manufacturing a nitride semiconductor light emitting device, the method comprising:
    forming a first group III nitride semiconductor layer on a substrate;
    etching an N-polarity region from a top surface of the first group III nitride semiconductor layer to form a recess in the first group III nitride semiconductor layer;
    forming a second group III nitride semiconductor layer formed on the first group III nitride semiconductor layer to fill the recess; and
    forming a light emitting structure on the second group III nitride semiconductor layer, the light emitting structure including a first conductivity type nitride semiconductor layer, an active layer, and a second conductivity type nitride semiconductor layer,
    wherein a bottom surface of the first group III nitride semiconductor layer in contact with the substrate is an N-rich surface exhibiting an N-polarity, and a top surface opposite to the bottom surface is a group III rich surface exhibiting a group III polarity.

17. The method of claim 16, wherein the substrate is a sapphire substrate.

18. The method of claim 16, wherein the etching of the N-polarity region is performed up to a depth allowing the surface of the substrate not to be exposed.

19. The method of claim 16, wherein the etching of the N-polarity region is performed up to a depth allowing the surface of the substrate to be exposed.

20. The method of claim 16, wherein the etching of the N-polarity region is performed by chemical wet etching.

* * * * *